United States Patent [19]

Desroches et al.

[11] Patent Number: 5,257,005
[45] Date of Patent: Oct. 26, 1993

[54] SMALL VALUE PRECISION INTEGRATED CIRCUIT RESISTORS

[76] Inventors: Alan R. Desroches, 5735 Seifert Ave., San Jose, Calif. 95118; Domingo A. Figueredo, 101 NE. Conifer Blvd., #U, Corvalis, Oreg. 97330

[21] Appl. No.: 931,615

[22] Filed: Aug. 18, 1992

[51] Int. Cl.$^5$ .................. H01C 1/14; H01C 1/012
[52] U.S. Cl. ................... 338/325; 338/306; 338/320; 338/323; 338/333; 338/307
[58] Field of Search ............ 338/325, 306, 320, 323, 338/333, 307

[56] References Cited

U.S. PATENT DOCUMENTS

| 3,964,087 | 6/1976 | Mallon | 338/306 |
| 4,219,797 | 8/1980 | Huang | 338/333 |
| 4,654,628 | 3/1987 | Takayanagi | 338/320 |
| 4,845,462 | 7/1989 | van de Grift et al. | 338/323 |

Primary Examiner—Marvin M. Lateef

[57] ABSTRACT

The effective parasitic end resistance of small-value precision integrated circuit resistors is reduced by providing N resistors connected in parallel and causing at least two of the resistors to share a terminal contact. The resulting integrated circuit resistor includes multiple terminal contacts of any number n greater than two. Of the n terminal contacts, N-1 terminal contacts are shared amongst said resistors. The parasitic end resistances are diminished by a factor equal to the number of resistors connected in parallel. By increasing the length of the active area of the N resistors by a factor equal to the number of the resistors, the desired resistance value remains undiminished. As a result, the parasitic end resistances may be made negligible compared to the desired resistance even for small value resistors.

8 Claims, 4 Drawing Sheets

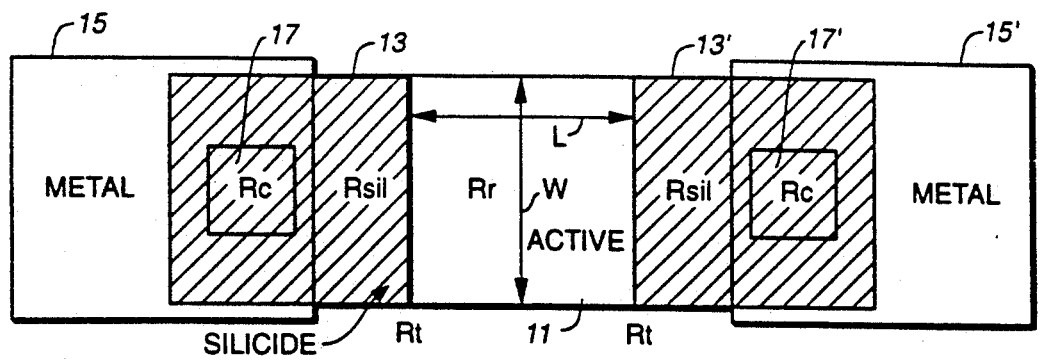
FIG._1A
(PRIOR ART)
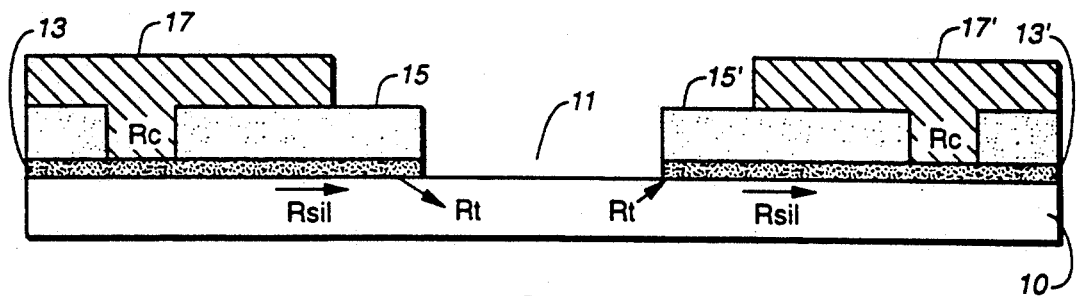
FIG._1B
(PRIOR ART)
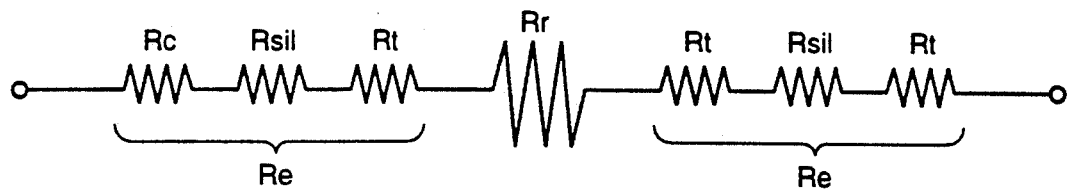
FIG._1C
(PRIOR ART)
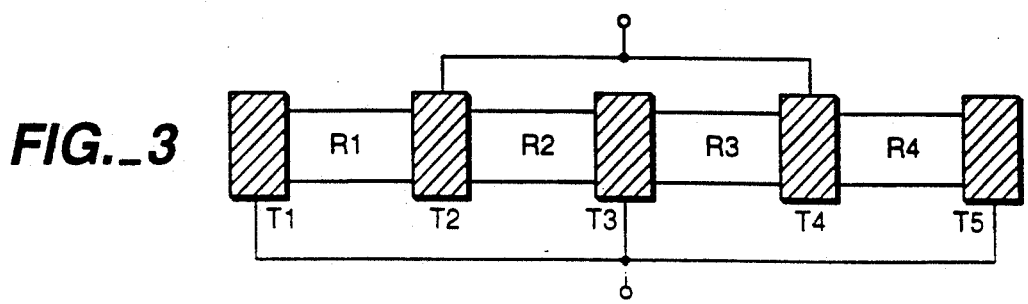
FIG._3

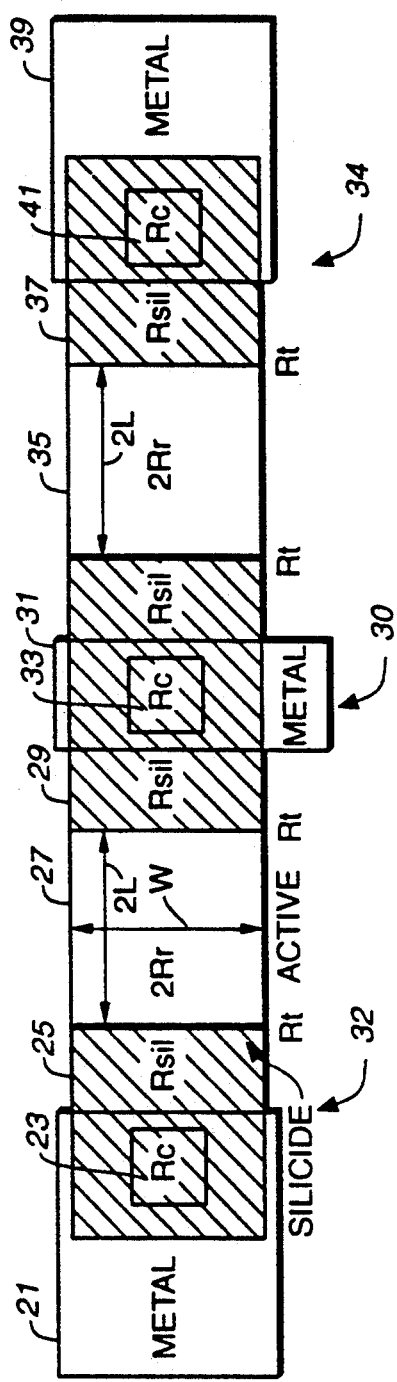
FIG._2A

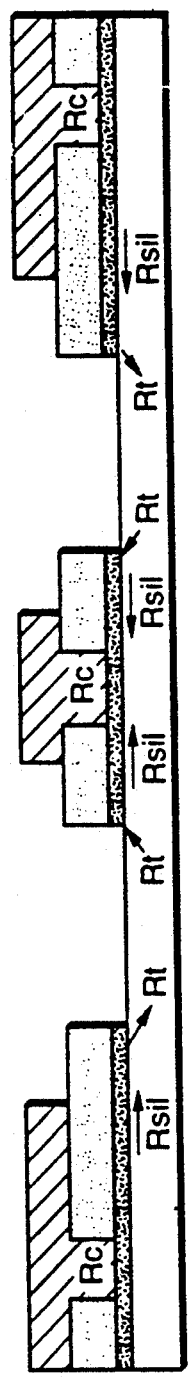
FIG._2B

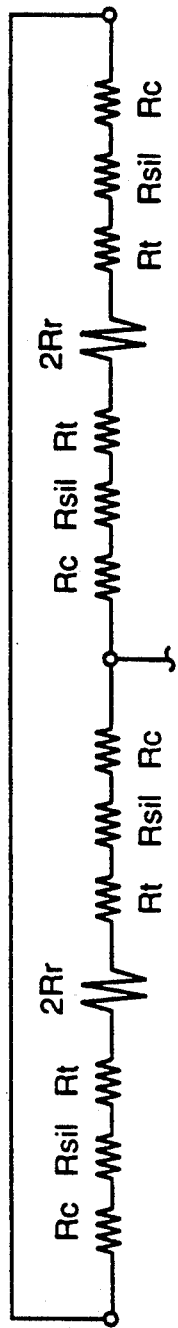
FIG._2C

SMALL VALUE PRECISION INTEGRATED CIRCUIT RESISTORS

BACKGROUND OF THE INVENTION

1. Field of the Invention

The present invention relates to integrated circuit resistors and more particularly to an advantageous structure for realizing small value precision integrated circuit resistors and a method of making the same so as to reduce the effect of parasitic end resistances.

2. State of the Art

Integrated circuit resistors are well-known. Applications specific integrated circuits (ASICs) often require small value precision resistors (less than 50 ohms), for example to achieve circuit matching. Small value precision resistors are difficult to manufacture because parasitic end resistances are often comparable to the value of the controlled resistance.

The layout of a typical integrated circuit resistor is shown in FIG. 1A. The resistor consists of an active area 11 having a length L and width W and, at both ends of the resistor, an adjoining silicided area (13, 13') covered either wholly or partially by a metal layer (15, 15') containing a contact (17, 17') to the silicided area, the contact also being formed of metal. A dielectric 18 isolates the metal and silicide except at the contact. A cross section of the resistor appears in FIG. 1B. The resistor material 11 is made up of a doped region of a silicon or polysilicon substrate 10, usually passivated with a layer 18 of silicon dioxide. The contacts 17 and 17', the silicided areas 13 and 13' and the active area 11 have associated therewith resistances Rc, Rsil and Rr respectively. The resistance of the metal is neglected for illustration purposes.

Further resistances Rt are exhibited along a critical length of an interface between the silicided areas 13 and 13' and the active area of the resistor 11. The silicided areas have very low sheet resistance and are formed by depositing titanium on the surface of the resistor material and heating the structure to about 800° C., causing the titanium to react with the silicon (or polysilicon) substrate surface to form titanium silicide. The silicide has a sheet resistance of only 2-5 ohms per square as compared with a sheet resistance of about 110 ohms per square for highly doped silicon. Current flowing into the resistor is therefore mostly confined to the silicided area except along a short critical length adjacent the active area 11 along which the current, having nowhere else to go, enters the active area. This transition region exhibits a resistance Rt. Similarly, current flowing out the resistor, as it reaches the edge of the doped active area, enters the low-resistance silicided area, the transition region again exhibiting a resistance Rt.

The equivalent circuit of the integrated circuit resistor is shown in FIG. 1C. The desired resistance Rr is connected at each end to a parasitic end resistance Re equal to the sum of the transition resistance Rt, the silicide resistance Rsil and the contact resistance Rc, such that $R_{TOT}=2R_c+2R_{sil}+2R_t+R_r$.

Normally, for resistors of several hundred ohms or more, the parasitic end resistances Re are negligible compared to the resistance Rr. Therefore, to form a resistor of a desired value, the active area 11 is doped to exhibit a suitable sheet resistance and the dimensions L and W are chosen such that $Rr=Ro*L/W$ where Ro is the sheet resistance of the active area.

As the desired resistance Rr decreases, however, the parasitic end resistances Re become more and more significant, making small value precision resistors difficult to realize. For resistance values less than 50 ohms, the transition parasitic resistances Rt alone become comparable to the value of Rr. Resistor variability then becomes a function not only of the lithographic control of L and W but also, undesirably, a function of the electrical quality of the silicide/active area interface. Moreover, the electrical quality of the silicide/active area interface is not always entirely predictable.

What is needed then, is a method of making small value precision resistors more easily, and an integrated circuit resistor structure in which the effects of parasitic end resistance are reduced.

SUMMARY OF THE INVENTION

According to the present invention, the effective parasitic end resistance of small-value precision integrated circuit resistors is reduced by providing multiple resistors connected in parallel and causing at least two of the resistors to share a terminal contact. The resulting integrated circuit resistor includes multiple terminal contacts of any number n greater than two. For an odd number of n terminal contacts, $(n+1)/2$ of the terminal contacts are connected to form one resistor terminal and $(n-1)/2$ contact terminals are connected to form another resistor terminal. For an even number of n terminals, $n/2$ of the terminal contacts are connected to form each of the two resistor terminals. The parasitic end resistances are diminished by a factor equal to the number of resistors connected in parallel. By increasing the length of the active area of the resistors by a factor equal to the number of the resistors, the desired resistance value remains undiminished. As a result, the parasitic end resistances may be made negligible compared to the desired resistance even for small value resistors.

BRIEF DESCRIPTION OF THE DRAWINGS

The present invention can be further understood with reference to the following description in conjunction with the appended drawings. In the drawings:

FIG. 1A is a plan view layout of a conventional integrated circuit resistor;

FIG. 1B is a cross sectional view of the integrated circuit resistor of 1A;

FIG. 1C is an equivalent circuit representation of the integrated circuit resistor of FIG. 1A;

FIG. 2A is a plan view layout of an integrated circuit resistor according to the present invention;

FIG. 2B is a sectional view of the integrated circuit resistor of FIG. 2A;

FIG. 2C is an equivalent circuit representation of the integrated circuit resistor of FIG. 2A; and FIG. 3 is a plan view layout of another integrated circuit resistor according to the present invention.

DETAILED DESCRIPTION OF THE PREFERRED EMBODIMENTS

FIG. 2A shows the layout of a multi-terminal resistor for reducing parasitic end resistance effects. In effect, two integrated circuit resistors are connected together in parallel but in such a manner as to share a common terminal. From left to right, the multi-terminal resistor layout includes a metal region 21, a contact 23 within the metal region 21, a silicided region 25 partially underlying the metal region, a first active region 27, a silicided region 29, a metal region 31, a contact 33 within the metal region 31, a second active region 35, a silicided region 37, a metal region 39 and a contact 41 within the metal region 39. The silicided region 29, the metal region 31 and the contact 33 together form a terminal contact 30 shared by the two resistors. A terminal contact 32 is formed by the metal region 21, the contact 23 and the silicided region 25, whereas a terminal contact 34 is formed by the metal region 39, the contact 41 and the silicided region 37. The two terminal contacts 32 and 34 are referred to as end terminals and are not shared by the resistors. Note that the first and second active regions 27 and 35 are equal in width but twice as long as the active area 11 in FIG. 1A, such that each of the active regions 27 and 35 exhibit a resistance 2Rr twice the resistance Rr of the active area 11 of FIG. 1A.

In practice, the two end terminals 32 and 34 are connected together to form one terminal of the resulting resistor structure and the common terminal contact 30 forms the other terminal of the resistor structure. For example, if a positive voltage were applied to the terminal contact 30 with respect to the end terminals 31 and 32, a current would flow into the terminal contact 30 and would then flow in equal proportions through the active regions 27 and 35, respectively, and out of end terminals 31 and 32 through a common connection.

A cross sectional view of the multi-terminal resistor is shown in FIG. 2B and an equivalent circuit diagram is shown in FIG. 2C. As may be seen from the equivalent circuit, two resistors are connected in parallel, each identical to the resistor of FIG. 1C except that Rr is doubled to become 2Rr. The total resistance of the resistor structure is therefore half the resistance of one of the resistors such that Rtot=Rc+Rsil+Rt+Rr. As compared to FIG. 1C, the parasitic end resistance is therefore halved.

A resistor structure having the same desired resistance and parasitic end resistance could also be obtained by simply doubling the width of all of the features of the resistor of FIG. 1A, substantially increasing the area of the resistor. The length of the active area would be doubled to maintain the desired resistance value. Depending on the process used, however, the capacitance associated with the resistor may potentially quadruple, a significant disadvantage in high frequency applications. In the multi-terminal resistor layout of FIG. 2A, on the other hand, the overall area of the resistor structure is significantly less, as is the parasitic capacitance. For example, if the resistor of FIG. 1A is made twice as wide, the silicided area doubles. In the case of the three terminal structure of FIG. 2A, the silicided area, and thus the total capacitance, increases only by half.

The multi-terminal resistor is not limited to three terminals but may have four, five or more terminals. Generally, the resistor structure may have any number of terminals greater than two. A five-terminal resistor structure is illustrated in FIG. 3. Between a first terminal T1 and second terminal T2 is the active area of a first resistor R1, between the second terminal T2 and the third terminal T3 as the active area of the second resistor R2, between the third terminal T3 and the fourth terminal T4 is the active area of a third resistor R3, and between the forth terminal T4 and the fifth terminal T5 is the active area of a fourth resistor R4. The terminals T1, T3 and T5 are connected to form one terminal of the resulting resistor structure, and the terminals T2 and T4 are connected to form the other terminal of the result in resistor structure. In the general case, the value of the resistor can be expressed as: Rtot=(2Re/N)+Ro (L/W)(1/N) where Re is the end resistance made up of the contact, silicide and transition parasitic resistance and N is the number of resistors used in the multi-finger structure. The length L is N times the value for a single resistor (shown in FIG. 1A).

Using the multi-terminal resistor layout, reduced end parasitic resistances may be achieved with a moderate increase in active area and hence parasitic capacitance. The multi-terminal resistor structure may be used with any type of integrated circuit resistor but is particularly applicable to silicon and polysilicon resistors. Furthermore, the disclosed structure may be used in any planar technology where resistors are needed including CMOS BiCMOS, GaAs, etc.

The foregoing has described the principles, preferred embodiments and modes of operation of the present invention. However, the invention should not be construed as limited to the particular embodiments discussed. The above-described embodiments should therefore be regarded as illustrative rather than restrictive. Variations may be made in those embodiments without departing from the scope of the present invention as defined by the following claims.

What is claimed is:

1. An integrated circuit resistor comprising:
   n terminal contacts where $n \geq 3$; and
   means for connecting a plurality of said terminal contacts less than n to form one resistor terminal and means for connecting terminal contacts other than said plurality to form another resistor terminal;
   whereby a parasitic end resistance effect of the integrated circuit resistor is reduced.

2. A method of reducing the effect of parasitic and resistance in small-value precision integrated circuit resistors, comprising the steps of:
   providing multiple resistors connected in parallel; and
   causing at least two of said resistors to share a terminal contact;
   whereby a parasitic and resistance effect of the integrated circuit resistor is reduced.

3. The method of claim 2 wherein N resistors are provided and are caused to share N+1 terminal contacts.

4. An integrated circuit resistor structure comprising:
   a plurality of N of resistance areas each having a substantially equal sheet resistance Ro, a substantially equal length L and substantially equal width W;
   terminal contacts each exhibiting a substantially equal end resistance Re, a pair of said terminal contacts being electrically connected to each of said resistance areas; and
   means for electrically connecting said terminal contacts to form two terminals exhibiting a resistance therebetween substantially equal to (2Re/N)+Ro(L/W)(1/N.)

5. The apparatus of claim 4 wherein said resistance areas are formed in silicon.

6. The apparatus of claim 4 wherein said resistance areas are formed in polysilicon.

7. The apparatus of claim 4 wherein said resistance areas are formed in any conductor or semiconductor resistor material.

8. An integrated circuit resistor comprising:
   three terminal contacts; and
   means for connecting two of said terminal contacts to form one resistor terminal, a remaining terminal contact forming another resistor terminal;
   whereby a parasitic end resistance effect of the integrated circuit resistor is reduced.

* * * * *